Figure 1:
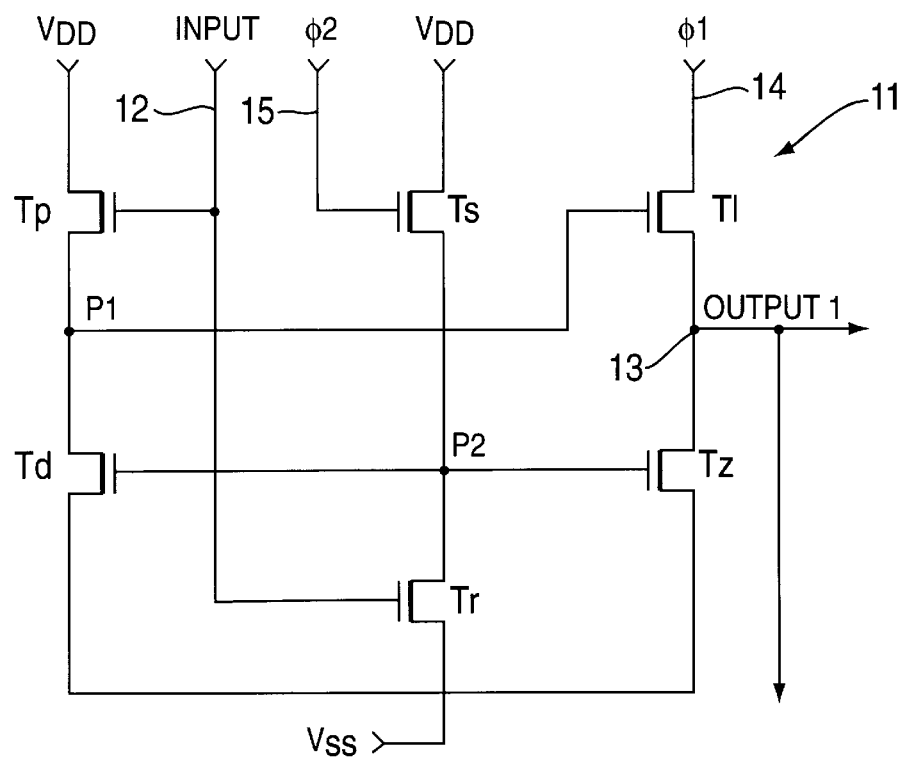

United States Patent
Maurice

[11] Patent Number: 6,052,426
[45] Date of Patent: Apr. 18, 2000

[54] SHIFT REGISTER USING M.I.S. TRANSISTORS OF LIKE POLARITY

[75] Inventor: François Maurice, Tullins, France

[73] Assignee: Thomson LCD, Paris, France

[21] Appl. No.: 08/737,192

[22] PCT Filed: May 16, 1995

[86] PCT No.: PCT/FR95/00634
§ 371 Date: Mar. 28, 1997
§ 102(e) Date: Mar. 28, 1997

[87] PCT Pub. No.: WO95/31804
PCT Pub. Date: Nov. 23, 1995

[30] Foreign Application Priority Data

May 17, 1994 [FR] France .................................. 94 05987

[51] Int. Cl.[7] .................................................. G11C 19/00
[52] U.S. Cl. .................................. 377/78; 377/79; 377/81
[58] Field of Search ................................ 377/78, 79, 81

[56] References Cited

U.S. PATENT DOCUMENTS

| | | | |
|---|---|---|---|
| 4,035,662 | 7/1977 | Kuo | 307/205 |
| 4,163,291 | 7/1979 | Suzuki et al. | 365/221 |
| 5,122,676 | 6/1992 | Stewart et al. | 307/265 |
| 5,410,583 | 4/1995 | Weisbrod et al. | 377/75 |

FOREIGN PATENT DOCUMENTS

| | | |
|---|---|---|
| 60-70599 | 8/1985 | Japan . |
| 2022953 | 12/1979 | United Kingdom . |
| 92/09985 | 6/1992 | WIPO . |

OTHER PUBLICATIONS

Patent Abstracts of Japan, vol. 9, No. 210 & Japanese Pat. 60–070599.

Primary Examiner—Margaret R. Wambach
Attorney, Agent, or Firm—Joseph S. Tripoli; Joseph J. Laks; Sammy S. Henig

[57] ABSTRACT

The subject of the present invention is a shift register for an LCD, the stages of which use the Boostrap [sic] effect and can contain just three M.I.S. transistors, as well as enhancements to this circuit with four or seven MIS transistors.

The advantages are the low number of components used, the increase in the lifetime of the shift register and the possibility of working with control signals having an amplitude of 5 or 10 v below that of the output signals.

38 Claims, 6 Drawing Sheets

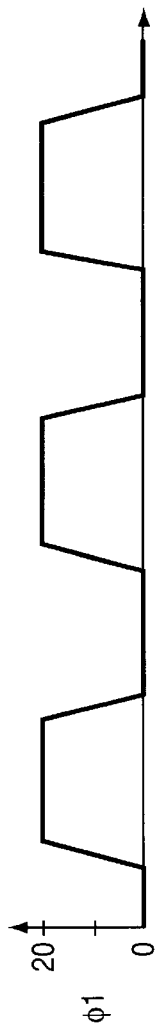
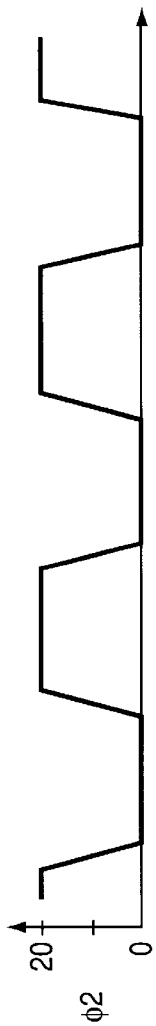
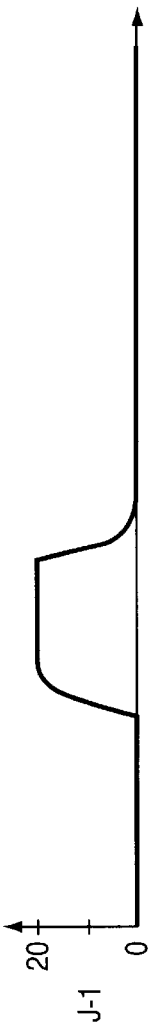
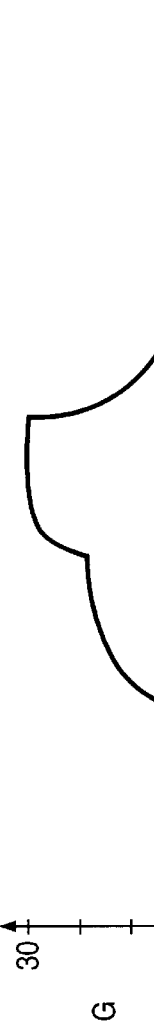
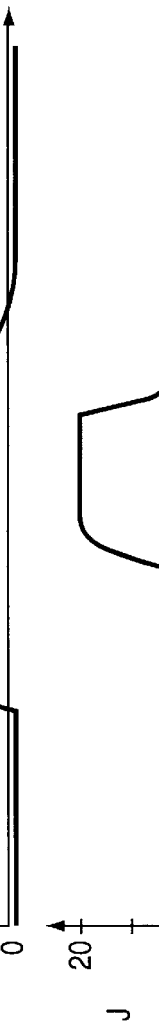
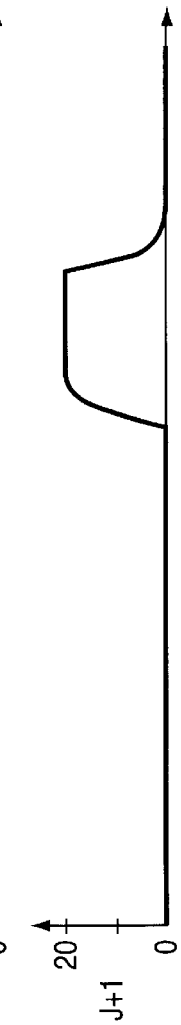
FIG. 3a  φ1
FIG. 3b  φ2
FIG. 3c  J-1
FIG. 3d  G
FIG. 3e  J
FIG. 3f  J+1

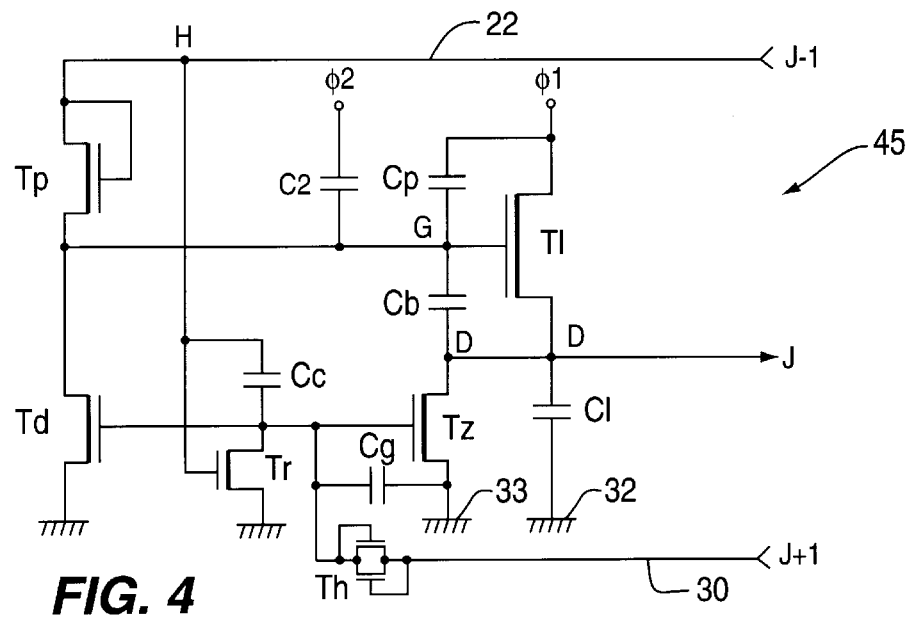
FIG. 4
FIG. 5a φ1
FIG. 5b φ2
FIG. 5c J-1
FIG. 5d G
FIG. 5e J
FIG. 5f J+1
FIG. 5g Z

SHIFT REGISTER USING M.I.S. TRANSISTORS OF LIKE POLARITY

The subject of the present invention is a shift register which can contain just three M.I.S. transistors and enhancements to this circuit, and in particular allowing the selection of lines of pixels from a flat screen.

A flat liquid crystal screen is made up of a number of electro-optical cells arranged in rows and columns, each controlled by a switching device and containing two electrodes bordering a liquid crystal whose optical properties are modified as a function of the value of the field traversing it. The switching device/electrode/liquid crystal/counter-electrode assembly constitutes a "pixel" (standing for "picture element"). The addressing of these pixels by the peripheral control electronics is performed by way of rows (selection lines) which control the on and off state of the switching devices, and of columns (data lines) which transmit, when the switching device is on, a voltage to be applied to the terminals of the electrodes corresponding to the data signal to be displayed (gray scale).

The electrodes, the switching devices, the rows and columns are deposited and etched on the same substrate board, and they constitute the active matrix of the screen. Advantageously, the peripheral control circuits, that is to say the selection lines scanner which selects the horizontal lines to be displayed, and the circuits which control the data lines, are integrated onto the same substrate board containing the active matrix and are manufactured at the same time as the latter.

In a flat television or computer screen, the fact that the number of pixels is very large, that the spacing of the grid of these pixels is very small, thus limiting the space available in which to place the control circuit, and that a large number of selection lines and data lines are [sic] required, compels the use of the smallest and simplest possible control circuits so as to achieve a high degree of manufacturing efficiency. It may moreover be advantageous to use semiconductor devices as pixel switching devices, with the same conductivity type throughout the display.

Control of these semiconductor devices can be undertaken by lines addressed by one or more shift registers. A register structure such as that represented in FIG. 1 provides a partial response to the requirements stated in the previous paragraph. A stage 11 of a register contains six transistors Tp, Td, Ts, Tr, Tl and Tz, and is fed with two clock signals $\Phi 1$ and $\Phi 2$ at 14 and 15, as well as with two positive sources Vdd and one (relatively) negative source Vss. The operation of a shift register made up of such stages is described in detail in International Patent Application WO 92/15992 filed by Thomson LCD. This operation relies on the fact that the gate of the transistor Tl which controls the output 13 of the stage of the register is left floating, and that its potential therefore follows those of the clock and of the output through a capacitive effect. This is the "Boostrap" effect. This allows, at the desired moment, complete charging of the output 13 to the highest potential of the clock $\Phi 1$. The transistor Tp allows the gate of the transistor Tl to be precharged and allows the transistor Td to discharge this gate.

When the stage in question is not selected, its output 13 should remain at the potential Vss. However, the drain of the transistor Tl is permanently excited by the clock $\Phi 1$, and a consequence of the bootstrap effect described above is that, with each clock beat $\Phi 1$, the gate of the transistor Tl recovers around half the amplitude of the signals of $\Phi 1$ (typically about ten volts), and the transistor then becomes slightly passing. It is therefore necessary to switch on the transistor Tz in order to evacuate the charge from the node of the output 13 and force this node to the potential Vss. Likewise, the transistor Td must be kept on over the same period in order to keep the gate voltage of the transistor Tl permanently at the value Vss. The transistors Td and Tz must therefore have a control voltage which is always positive except when the stage is selected. This control voltage at the node P2 is controlled by a R/S (standing for "Reset/Set") toggle made up of two transistors Tr (Reset) and Ts (Set), the dimensions of the transistor Tr being greater than those of the transistor Ts, reset has priority. The clock $\Phi 2$ regularly turns on at 15 the set-transistor Ts, taking the node P2 to Vdd, until the input operates the priority reset-transistor Tr at 12 in order to switch off the transistor Tz and allow the transistor Tl, which is on, to bias the output node 13.

In short, although the bootstrap effect allows proper charging of the outputs, it is accompanied by stray effects which make it necessary to use three supplementary transistors Tz, Tr and Ts. Another drawback of the solution described in FIG. 1 is that the transistors Td and Ts undergo permanent gate stress (that is to say a positive voltage on the gate), a consequence of which may be the drifting of their threshold voltage and in due course a malfunction of the entire device.

The present invention enables these drawbacks to be avoided and proposes simple circuits with three, four or seven transistors, having prolonged lifetimes.

Thus, a first embodiment of the invention relates to a shift register containing a plurality of cascaded three-transistor stages, each one of them being connected up to two clock signals, to the outputs of the preceding stage and the next stage, and characterized in that it includes a first semiconductor output device switching the associated output between high and low values of a first clock signal, this first semiconductor device being controlled by the potential of a first node connected:

- to the output of the preceding stage across a second semiconductor device controlled by this same preceding output,
- to a negative potential across a third semiconductor device controlled by the output of the next stage,
- to a second clock signal across a first capacitance,
- and to the output associated with the stage across a second capacitance.

A second embodiment of the invention relates to a shift register of the same type as the one above, but the stages of which contain seven transistors as well as a first node connected:

- to the output of the preceding stage across a second semiconductor device controlled by this same preceding output,
- to a second clock signal across a first capacitance,
- to the output associated with the stage across a second capacitance, the said output being connected to earth across a third semiconductor device controlled by a second node,
- and to earth across a fourth semiconductor device controlled by the second node, this second node being connected moreover:

- to the output of the preceding stage across a fourth capacitance,
- to earth across a fifth semiconductor device controlled by the output of the preceding stage,
- to the output of the next stage across sixth and seventh clamping transistors mounted in parallel and controlled, one by the second node and the other by the output of the next stage, and to that terminal of the third semiconductor device connected to earth, by a capacitance.

A third embodiment of the invention relates to a shift register of the same type as those above, but the stages of which contain four transistors as well as a first node connected:

to the output of the preceding stage across a second semiconductor device controlled by this same preceding output, to a second clock signal across a first capacitance, to the output associated with the stage across a second capacitance, the said output being connected to earth across a fourth semiconductor device controlled by a second node, to a negative potential across a third semiconductor device controlled by the second node which is moreover connected to the output of the next stage or of the next but one stage.

A fourth embodiment of the invention relates to a shift register of the same type as the previous register, but in which the third and fourth semiconductor devices of the stages are controlled respectively by the output of the next stage and by a zero-reset signal.

Finally, a fifth embodiment of the invention relates to a register of the same type as the two previous registers but in which the third and fourth semiconductor devices of the stages are controlled respectively by a clock signal chosen from three and a zero-reset signal.

According to important characteristics of the invention, the first and second clock signals are complementary, the first capacitance has a value equivalent to the value of the stray capacitance of the semiconductor output device, and the second capacitance a value substantially greater than that of the stray capacitance of the semiconductor output device.

The present invention also extends to all types of flat active-matrix screens which use peripheral or integrated control circuits.

Moreover, the invention also extends to screens furnished with an enhancement consisting in adding a supplementary conductive column which crosses over the selection lines and is coupled capacitively to each of them in such a way that the corresponding coupling capacitances each have a value close to the sum of the coupling capacitances between a line and the columns which it crosses. This supplementary column can also be associated with a supplementary conductive line capacitively coupled with it and associated with it across a comparator circuit, this supplementary line being capacitively coupled to each of the columns.

The bootstrap effect described above is obtained without any counter-effect. When the stage is idle, there is no longer any positive gate stress and three transistors, one clock and one supply can be discarded as compared with the prior art and, moreover, two embodiments of the invention with seven and four transistors make it possible to work with control signals having an amplitude of 5 to 10 volts below that of the output signals.

Figure 2:
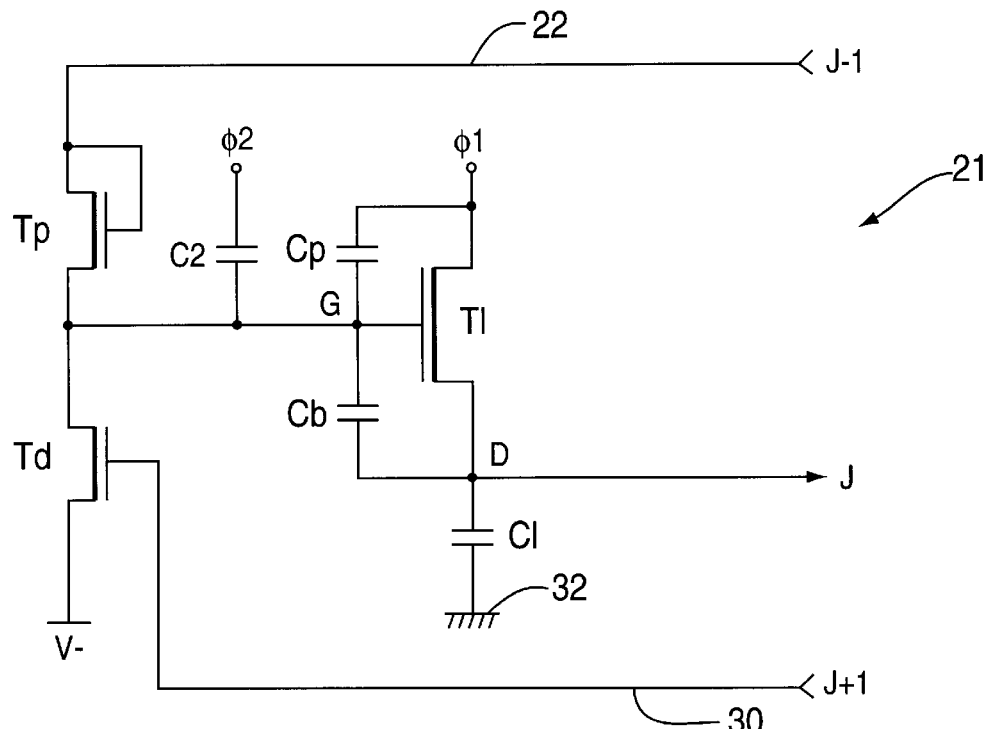
Figure 6:
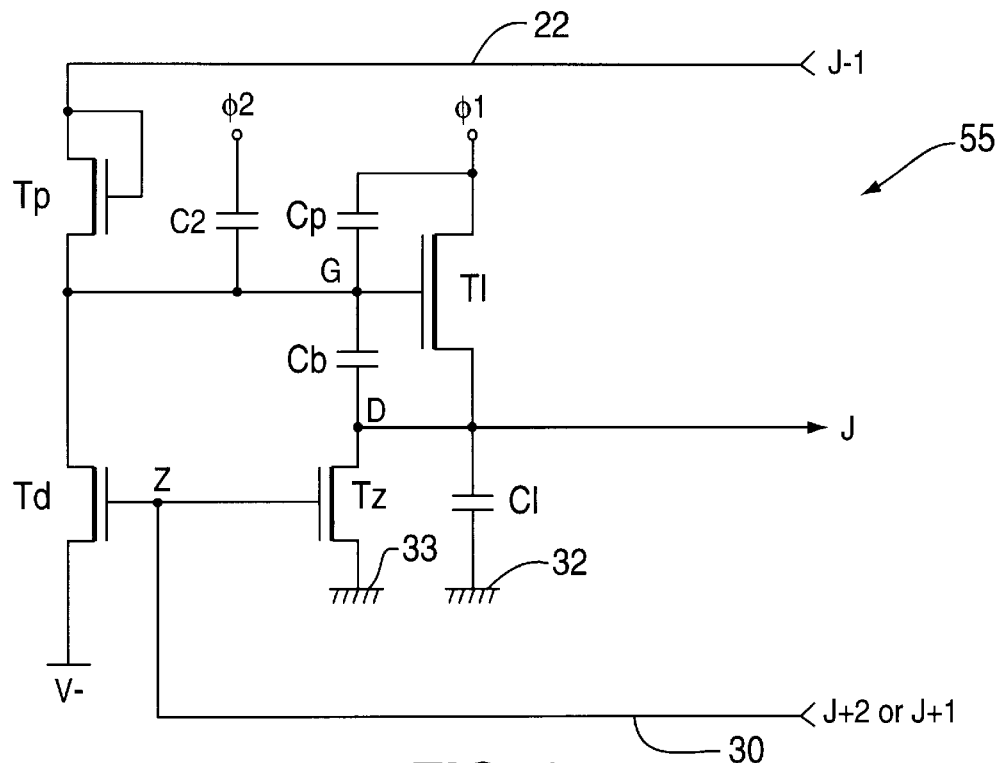
Figure 7:
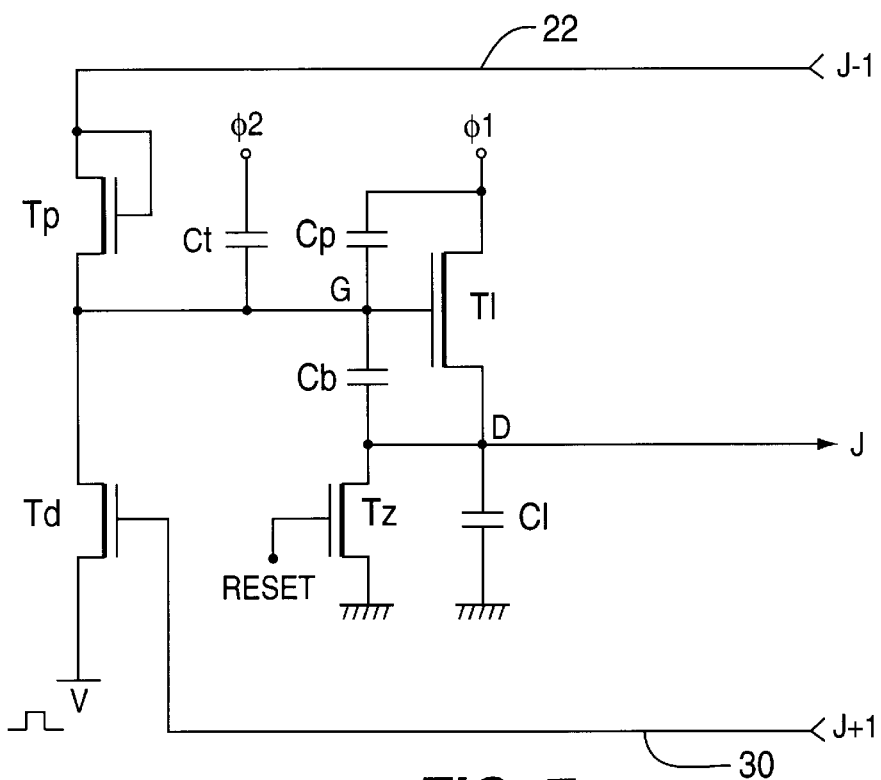
Figure 8:
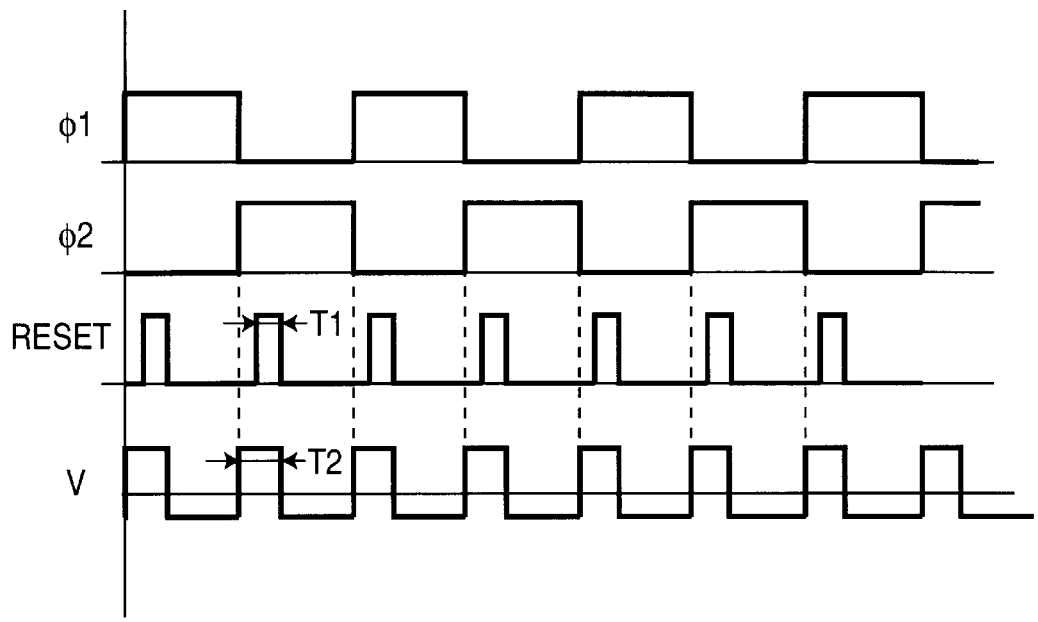
Figure 9:
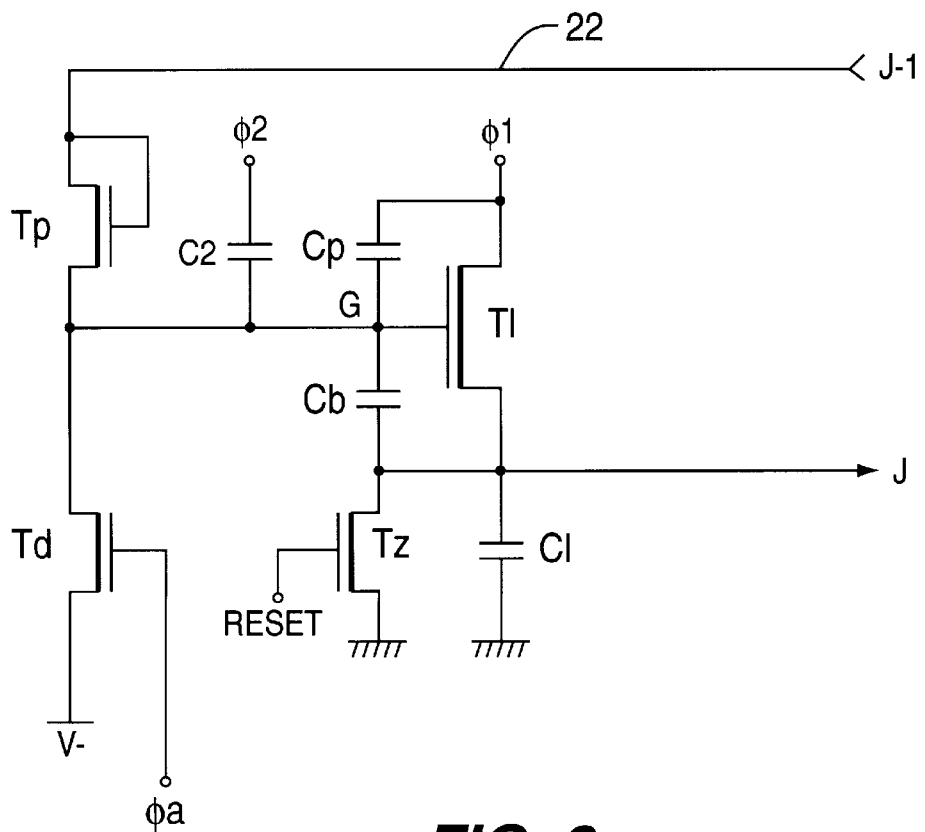
Figure 10:
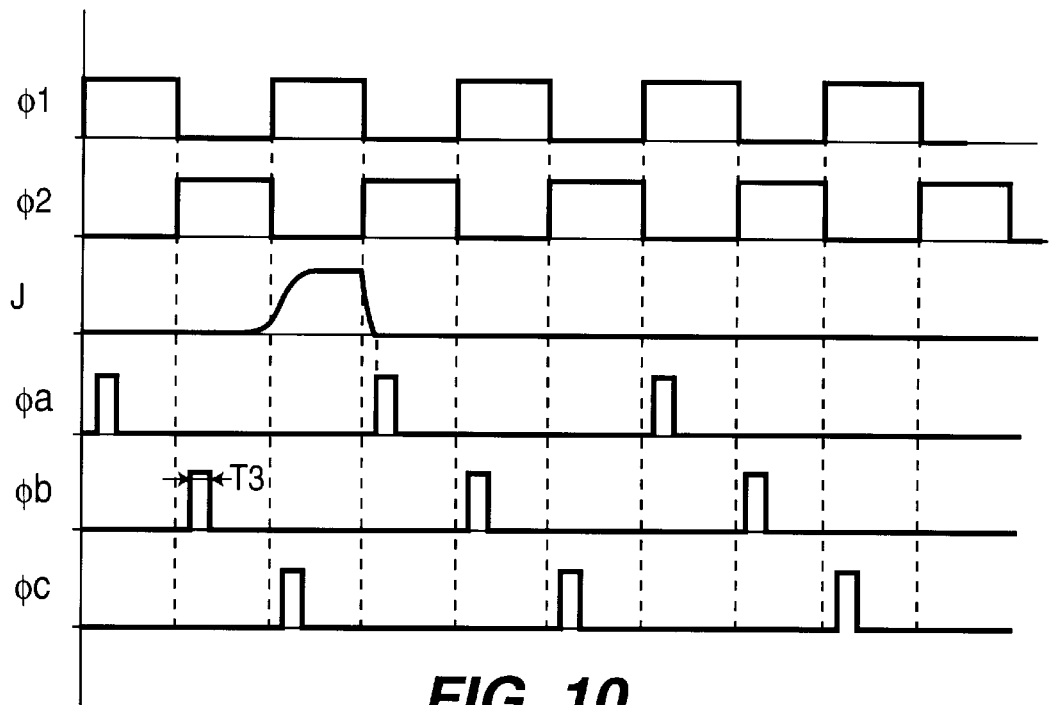
Figure 11:
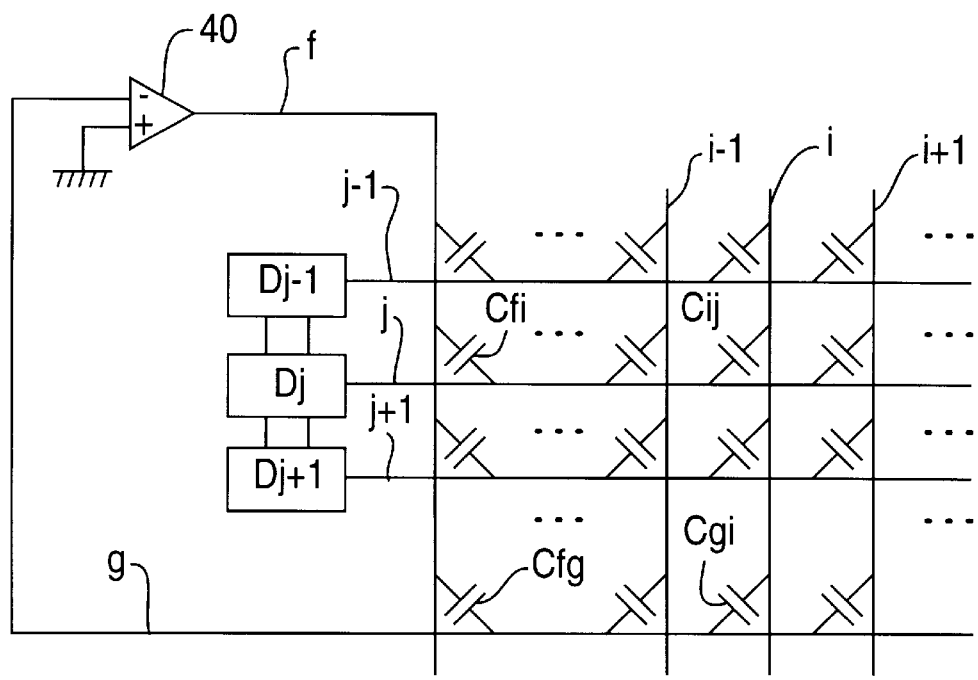

The present invention will be better understood and further advantages will emerge on reading the description which follows, illustrated with the following figures:

FIG. 1 already described represents a stage 11 of a shift register according to the prior art, FIG. 2 represents a first embodiment of a shift register stage according to the invention using three transistors, FIGS. 3a to 3f represent the timing diagram of the elements of the device of FIG. 2, FIG. 4 represents a second embodiment of the invention using seven transistors, FIGS. 5a to 5g represent an example of a timing diagram for the elements of the device of FIG. 4, FIG. 6 represents a third embodiment of the invention using four transistors, FIG. 7 represents a fourth embodiment of the invention also using four transistors, FIG. 8 represents the timing diagram for the device of FIG. 7, FIG. 9 represents a fifth embodiment of the invention using four transistors, FIG. 10 represents the timing diagram for the device of FIG. 9, and FIG. 11 represents an enhancement to the present invention.

In the various figures, the elements having a function which is identical or equivalent from one figure to the other have retained the same references. The various embodiments of the invention which are represented in these figures are shift register stages of integrated drivers controlling liquid crystal screens made with thin-film transistors, but it is obvious that the invention applies to any type of large area electronic circuit made with any semiconductor devices.

According to the present invention, in FIG. 2, there is represented a stage 21 with three transistors Tl, Tp and Td, of a shift register controlling a selection line J, and connected at 22 to the preceding line J−1 as well as to the next line J+1 at 30. This circuit is moreover fed with a (relatively) negative source V− and two clocks $\Phi1$ and $\Phi2$. The structure of this circuit is described below.

This stage is connected at 22 to the preceding line J−1 by the drain of the transistor Tp, a transistor for precharging the gate of the transistor Tl which controls the node D of the output in line J. The gate of the transistor Tp being connected to its drain, this transistor Tl is turned on by the potential of the output line J−1 from the preceding stage at 22. The transistor Tp controls the node G connected to the negative source V− by the transistor Td, itself controlled by the potential of the output line J+1 from the next stage at 30.

The node D is connected to the source of the transistor Tl, to the node G via a capacitance Cb, and to the line J to be selected, whose load is symbolized electrically by a capacitance Cl.

A clock signal $\Phi1$ is supplied to the drain of the output transistor Tl. Between the drain and the gate (node G) of this transistor there is a stray capacitance Cp responsible for the bootstrap effect described above with reference to FIG. 1 of the prior art. According to an important characteristic of the invention, a clock $\Phi2$ which is exactly complementary to the clock $\Phi1$ is connected to the node G via a capacitance C2, with a value equivalent to that of the stray capacitance Cp.

Thus, these stray effects—consequences of the bootstrap effect—are counterbalanced by virtue of the linking of the clock $\Phi2$, the complement of the clock $\Phi1$, with the gate of the transistor Tl via the capacitance C2, with a value equivalent to that of Cp. Since the two clocks are exactly complementary they do not give rise to any stray voltage at the node G and hence at the gate of the transistor Tl. An equivalent circuit contains a capacitance Cl=2×C2 between the node G and earth 32.

Since such a structure diminishes the bootstrap effect, it is necessary to add a bootstrap capacitance Cb between the source node D and the gate node G so that the voltage of the gate follows a fraction Cb/(Cb+2×Cp) of the variations of the source voltage. Thus, in order to attain a bootstrap ratio of 60%, it suffices for Cb to be three times the value of C2.

Thus, such a circuit preserves the bootstrap effect without its secondary effects described above. The lifetime of the circuit, and hence of the entire device, is prolonged, and the number of transistors required is halved as compared with the prior art. A further advantage of this embodiment of the present invention is that the positive supplies Vdd of the prior art have been discarded. In fact, since the gate and the drain of the precharge transistor Td are connected, when the stage 21 is not selected, the two series transistors Tp and Td carry out the function of the transistor Tz of FIG. 1, drawing current from the line J−1 towards the negative voltage V−. The two transistors then have gate-source voltages which are below their threshold voltage, and their channel current is an exponential function of these voltages. This layout results in the gate voltage of the transistor Tl being around 1 volt below its source voltage, and this transistor will therefore be blocked better than in the prior art where the two voltages are equal. Thus, when a stage of the register according to the invention is not selected, all its transistors have a gate voltage below their threshold voltages, leading to minimized fatigue.

The operation of this circuit will be better understood in the light of the timing diagrams 3a to 3f, each of them showing a time scale as abscissa and a potential as ordinate. When the preceding stage J−1 sends a pulse (FIG. 3c) at 22, the precharge transistor Tp is on and charges the bootstrap capacitance Cb. The potential of the gate node G (FIG. 3d) rises to that of the line J−1 corresponding to the preceding stage, from which must be deducted substantially the value of the threshold voltage of the transistor Tp. The transistor Tl is then on. When the clock Φ1 rises in turn (FIG. 3a), as in the prior art of FIG. 1, the output J follows, carrying with it the gate of the transistor Tl by virtue of the bootstrap capacitance Cb (FIG. 3d). The transistor Tl is then fully on and the node D and the line J follow the potential of the clock Φ1 perfectly (FIG. 3e) until it falls. At this moment the next line J+1 rises (FIG. 3f) and turns on the transistor Td which discharges the bootstrap capacitance Cb so that the transistor Tl is no longer on for the succeeding clock beats (FIG. 3d).

The transistor Td should not be overdimensioned, so that the transistor Tl remains on for long enough for the output J to return completely to zero. As the source of the transistor Tl is slightly negatively biased, the node G attains a negative voltage when idle, so that the transistor Tl is blocked to a relatively greater degree than in the prior art of FIG. 1.

Represented in FIG. 4 is a second embodiment of a stage 45 of a shift register according to the invention. In this figure are again found the three transistors Tl, Tp and Td, the two inputs J−1 at 22 and J+1 at 30 corresponding respectively to the preceding and next stages, the two opposed clock inputs Φ1 and Φ2, the output J of stage 45 on the associated selection line J, as well as the capacitances Cp, C2, Cb and Cl of the embodiment of the invention as described with reference to FIGS. 2 and 3a to 3g.

According to an important characteristic of the invention, a transistor Tz for resetting the source of the output transistor Tl to zero connects the bootstrap capacitance Cb to earth at 33. The gate of this transistor Tz is controlled by the node Z, connected on one side to the gate of the discharge transistor Td and on the other hand to the next line J+1 via two clamping transistors (gate connected to the source) Th and Tg mounted in parallel head-to-tail, the drains of the two transistors being connected to the sources and the gates being controlled by the sources. That is to say that one, the transistor Tg, is controlled by the node Z and the other, the transistor Th by the line of the next stage J+1. A capacitance Cg is connected on one side to the node Z and on the other to earth at 33.

Moreover, the transistor Td connects the node G to earth, and its gate is controlled by the node Z. The latter is connected to earth across a transistor Tr whose gate is controlled by the node H, that is to say by the output J−1 of the preceding stage. The node Z is furthermore connected to the node H by a capacitance Cc.

The operation of this circuit is essentially the same, in respect of the common parts, as that of the circuit of FIGS. 2 and 3a to 3f of the previous embodiment of the invention. The enhancement as compared with the latter embodiment is that, when idle, the gates of the transistors Tz and Td, that is to say the node Z, are maintained at the level of their threshold voltage. These transistors are then sufficiently passing to maintain the nodes G and D at the low potential. In this case, the transistor Tp no longer serves under these conditions to bring the potential of the outputs to the low point. By virtue of the two transistors Th and Tg by which it is connected to the line 30 (the line of the following stage), the potential of the node Z is maintained at the threshold voltage of the transistors Td and Tz. The node Z will therefore follow the voltage variations of J+1 with a voltage lag equivalent to the threshold voltage of the transistors. Thus, when J+1 rises, the node Z reaches the positive voltage minus the threshold voltage, and the potentials of the nodes G and D are brought to zero. The transistors Td and Tz are then fully on.

When the potential of line J+1 returns to zero, the potential of node Z retains the value of the threshold voltage of the transistors Tp and Tz which retain some conductivity.

The role of the capacitance Cc is to weaken the effect of the capacitive couplings across the transistors Th and Tg to the line J−1, as well as to the source and gate of the transistor Tl.

When idle, the latter has a zero rather than a negative gate voltage. Its passing state is therefore better than in the previous solution with three transistors. The transistor Tz will however override the transistor Tl since it is biased to its conduction threshold. Hence, the return of the idle outputs to zero is guaranteed. Another advantage of this solution with seven transistors is that the output impedance of the stage 45 is lower than that of the solution with three transistors.

Since the node Z is at relatively high impedance, the transistor Tr enables the gate voltage of the transistors Td and Tz to be brought to zero at the time of precharging, that is to say when the stage is preselected. The blocked transistor Td will enable the charging of the capacitance Cb to be more complete, and the blocked transistor Tr will allow the output to rise to its maximum level. Finally, in order to prevent the voltage of the node Z from rising when the level of the output rises, the capacitance Cc should have a value equivalent to that of the gate-drain capacitance of the transistor Tz.

The operation of this circuit will be better understood in the light of the timing diagrams 5a to 5g, each of them showing a time scale as abscissa and a potential as ordinate when the clocks have a smaller swing than that of the outputs. As in the previous embodiment, the clocks Φ1 and Φ2 are opposed (FIGS. 5a and 5b). The outputs J−1 (FIG. 5c), J (FIG. 5e) and J+1 (FIG. 5f) include three plateaux: the low voltage level of the device when idle, the low level of the clocks when J−1 is active, and the high level of the clocks at selection.

When the stage 45 is selected, that is to say in order that the line J, the output of stage 45, be suitably charged (FIG. 5e), the node Z must remain at the level of the threshold voltage of the transistors Td and Tz. But, at this instant, J+1 is at the low level of the clocks (FIG. 5f). Bearing in mind the existence of the transistors Th and Tg, the low level of the clocks must therefore not exceed twice the threshold voltage of the transistors.

Thus, this device enhances the present invention insofar as it enables the amplitude of the clocks Φ1 and Φ2 to be reduced by twice the threshold voltage of the transistors, namely, in the example of the amorphous silicon (a-Si) transistors, a value of between 5 and 7 volts.

A third embodiment of the present invention is represented in FIG. 6 and, like the previous embodiment, allows the use of input signals of low amplitude. This solution requires just four transistors.

In this FIG. 6 are again found the three transistors Tl, Tp and Td, the two inputs J−1 at 22 and J+1 at 30 corresponding to the preceding and next stages respectively, the two opposed clock inputs Φ1 and Φ2, the output J of stage 55 on the associated selection line J, as well as the capacitances Cp, C2, Cb and Cl of the embodiment of the invention and its first enhancement which were described in the previous figures. The operation of this common part is identical to that described earlier.

This time the enhancement originates from the fact that the gates of the zero-reset transistors Tz and Tp can be connected via the node Z directly to the line J+1 or to the line J+2, that is to say to the output line of the next but one stage. Such a structure makes it possible to dispense with the transistors Tr and Th, as well as with the capacitances Cc and Cg of the previous device. In this case it is necessary for the low clock level which J+2 reaches when J has to return to zero to be sufficient to make the transistors Td and Tz correctly passing (for example 10 volts for amorphous silicon).

This circuit therefore allies simplicity, since it requires just four transistors, and performance since it allows a saving of the order of 10 volts in the control voltages.

A fourth embodiment of the invention is represented by FIG. 7. This differs from the previous embodiment of FIG. 6 through the fact that the gates of the transistors Td and Tz are no longer common-connected to the succeeding lines. The gate of the transistor Tz is controlled by a reset (re-initializing) signal, the transistor Td is controlled by the next line J+1 and connects the node G to a signal V.

The reset signal controlling the gate of the transistor Tz is a signal consisting of a short pulse of width Tl lagging in phase with respect to the clock signals Φ1 and Φ2, and which has a period equal to half that of Φ1 and Φ2, as is illustrated by FIG. 8. Moreover, the transistor Td whose gate is controlled by the next line J+1 is activated at its source by a signal V with the same frequency as the reset signal controlling the transistor Tz, and with width T2 at the start of each half-period. This is so as to prevent the transistor Td from discharging the node G too quickly, before the node D, that is to say the line J, has fallen back to the earth level. In fact, when V is positive for the duration T2, the transistor Td cannot discharge the point G, so that Tl can bring the potential of line J (node D) to earth. Thus, each output is earthed at each line addressing time for the short duration T1. This embodiment of the invention may be termed "medium impedance" (low impedance only during the time for which the reset lasts and high impedance for the remainder of the time).

A fifth embodiment of the invention represented in FIG. 9 consists in controlling the gate of the transistor Tz with a reset signal and controlling the gate of the transistor Td with a clock signal Φa chosen from three clock signals Φa, Φb and Φc. The source of the transistor Td is maintained at a constant negative potential V−. As FIG. 10 shows, each of these clocks consists of a short pulse of duration T3 lagging behind the alternating transitions of Φ1 and Φ2, and has a repeat period which is three times that of the reset signal. The three clocks Φa, Φb and Φc are derived from one another through a lag equal to the reset period which corresponds to the line addressing period. This embodiment may be termed "low impedance".

Moreover, the present invention also relates to an enhancement to the present invention with high or medium impedance, making it possible to compensate for the capacitive couplings which exist between the rows and columns of a screen using this type of line driver.

In fact, as shown by FIG. 11, which represents a diagrammatic part of a screen containing columns i and rows j controlled by line drivers Dj, when the outputs of a driver Dj of a selection line j are not at low impedance, there are non-negligible capacitive couplings Cij between lines i-1, i and i+1 and columns j−1, j and j+1, which, when these latter are idle, may give rise to unacceptable voltages possibly going as far as a change of state of the transistors situated approximately at the intersections of the rows and columns of the active matrix, but not represented in FIG. 11.

The enhancement to the present invention consists in compensating for these couplings by a column or a bus f capacitively coupled (Cfj) to each of the lines J−1, j and j+1 of the screen. This capacitance should have a value close to the sum of the coupling capacitances Cij between a line and the columns which it crosses. The column f can be activated with each change of polarity on the columns as upon frame reversals or line reversals. Another means of controlling this column f may be to associate therewith, across a comparator 40, a line g itself also coupled capacitively (Cgi) to the columns i-1, i and i+1 which it crosses. This line g thus makes it possible to detect the couplings with the columns of the screen and to correct the potential of the column f by virtue of the capacitive coupling Cfg between column f and line g. This enhancement applies by preference to the present invention but may be readily extended to all types of flat active-matrix screen controlled via rows and columns by peripheral circuits, either external to or integrated with the screen.

The present invention and its enhancements apply to all shift registers with capacitive output loads, and in particular to control circuit integrated shift registers addressing the lines of a viewing screen. This invention and its enhancements may also be applied in a general way to all large area electronic circuits made with thin-film transistors, as for example fax machine contact scanners or digitizing tablets.

I claim:

1. Shift register containing a plurality of cascaded stages, a given stage being responsive to two clock signals, said given stage having an output and being coupled to an output of a preceding stage and to an output of a next stage, said given stage comprising:

a first semiconductor output device switching the output of said given stage between high and low values of a first clock signal, the first semiconductor device being controlled by the potential of a first node connected:

to the output of the preceding stage via a second semiconductor device controlled by the output of the preceding stage, to a negative potential via a third semiconductor device controlled by the output of the next stage, to a second clock signal via a first capacitance, and to the output of the given stage via a second capacitance.

2. Shift register according to claim 1, wherein the first and second clock signals are complementary.

3. Shift register according to claim 1, wherein the first capacitance has a value slightly greater than the value of a stray capacitance of the first semiconductor output device.

4. Shift register according to claim 3 wherein the second capacitance has a value substantially greater to that of the stray capacitance (Cp) of the first semiconductor output device.

5. Shift register according to claim 1, wherein the first capacitance has a value slightly less than the value of a stray capacitance of the first semiconductor output device.

6. Shift register according to claim 5 wherein the second capacitance has a value substantially greater to that of a stray capacitance of the first semiconductor output device.

7. Shift register according to claim 1, wherein the first, second and third semiconductor devices are amorphous silicon transistors.

8. Shift register according to claim 1, wherein the outputs of the given, next and preceding stages are used for addressing an active matrix of a liquid crystal screen.

9. Shift register according to claim 1 wherein said shift register is included in integrated peripheral control circuits made up of selection line scanners and column scanners.

10. Shift register containing a plurality of cascaded stages, a given stage being responsive to two clock signals, said given stage having an output and being coupled to an output of a preceding stage, and to an output of a next stage, the given stage comprising:
   a first semiconductor output device switching the output of said given stage between high and low values of a first clock signal, the first semiconductor device being controlled by the potential of a first node connected:
      to the output of the preceding stage via a second semiconductor device controlled by this same preceding stage output,
      to a second clock signal via a first capacitance,
      to the output of said given stage via a second capacitance, the given stage output being connected to earth via a third semiconductor device controlled by a second node,
   and to earth across a fourth semiconductor device controlled by the second node, the second node being further connected:
      to the output of the preceding stage via a fourth capacitance,
      to earth via a fifth semiconductor device controlled by the output of the preceding stage,
      to the output of the next stage via sixth and seventh clamping transistors mounted in parallel and controlled, one by the second node and the other by the output of the next stage,
   and to a terminal of the third semiconductor device connected to earth, by a fifth capacitance.

11. Shift register according to claim 10 wherein the first and second clock signals are complementary.

12. Shift register according to claim 10 wherein the first capacitance has a value slightly greater than the value of a stray capacitance of the first semiconductor output device.

13. Shift register according to claim 10 wherein the first capacitance has a value slightly less than the value of a stray capacitance of the first semiconductor output device.

14. Shift register according to claim 10 wherein the semiconductor devices are amorphous silicon transistors.

15. Shift register according to claim 10 wherein the outputs of the stages are used for addressing an active matrix of a liquid crystal screen.

16. Shift register according to claim 10 wherein said shift register is included in integrated peripheral control circuits made up of selection line scanners, and column scanners.

17. Shift register containing a plurality of cascaded stages, a given stage being responsive to two clock signals, said given stage having an output and being coupled to an output of a preceding stage and to an output of one of a next stage and of a stage following the next stage, the given stage comprising:
   a first semiconductor output device switching a selection line connected to the output of the given stage between high and low values of a first clock signal, the first semiconductor device being controlled by the potential of a first node connected:
      to the output of the preceding stage via a second semiconductor device controlled by the preceding stage output,
      to a second clock signal via a first capacitance,
      to the output of the given stage via a second capacitance, the given stage output being connected to earth via a fourth semiconductor device controlled by a second node, and
      to a negative potential via a third semiconductor device controlled by the second node which is further connected to one of the output of the next stage and of the stage following the next stage.

18. Shift register according to claim 17 wherein the first and second clock signals are complementary.

19. Shift register according to claim 17 wherein the first capacitance has a value slightly greater than the value of a stray capacitance of the first semiconductor output device.

20. Shift register according to claim 17 wherein the first capacitance has a value slightly less than the value of a stray capacitance of the first semiconductor output device.

21. Shift register according to claim 17 wherein the semiconductor devices are amorphous silicon transistors.

22. Shift register according to claim 17 wherein the outputs of the stages are used for addressing an active matrix of a liquid crystal screen.

23. Shift register according to claim 17 wherein said shift register is included in integrated peripheral control circuits made up of selection line scanners, and column scanners.

24. Shift register containing a plurality of cascaded stages, a given stage being responsive to two clock signals, said given stage having an output and being coupled to an output of a preceding stage and to an output of a next stage, said given stage comprising:
   a first semiconductor output device switching the given stage output between high and low values of a first clock signal, the first semiconductor device being controlled by the potential of a first node connected:
      to the output of the preceding stage via a second semiconductor device controlled by the preceding stage output,
      to a signal via a third semiconductor device controlled by the output of the next stage,
      to a second clock signal via a first capacitance,
      and to the output of the given stage via a second capacitance, the given stage output being connected to earth via a fourth semiconductor device controlled by a zero-reset signal.

25. Shift register according to claim 24 wherein the first and second clock signals are complementary.

26. Shift register according to claim 24 wherein the first capacitance has a value slightly greater than the value of a stray capacitance of the first semiconductor output device.

27. Shift register according to claim 24 wherein the first capacitance has a value slightly less than the value of a stray capacitance of the first semiconductor output device.

28. Shift register according to claim 24 wherein the semiconductor devices are amorphous silicon transistors.

29. Shift register according to claim 24 wherein the outputs of the stages are used for addressing an active matrix of a liquid crystal screen.

30. Shift register according to claim 24 wherein said shift register is included in integrated peripheral control circuits made up of selection line scanners, and column scanners.

31. Shift register containing a plurality of cascaded stages, a given stage being responsive to two clock signals, said given stage having an output and being coupled to an output of a preceding stage and to an output of a next stage, said given stage comprising:

a first semiconductor output device switching the output of said given stage between high and low values of a first clock signal, the first semiconductor device being controlled by the potential of a first node connected:

to the output of the preceding stage via a second semiconductor device controlled by this same preceding stage output, to a constant negative potential via a third semiconductor device controlled by a clock signal chosen from three clock signals, to a second clock signal via a first capacitance, and to the output of the given stage via a second capacitance, the given stage output being connected to earth via a fourth semiconductor device controlled by a zero-reset signal.

32. Shift register according to claim 31, wherein each of the three clock signals includes a short pulse lagging behind the transitions of the first and second clock signals.

33. Shift register according to claim 31 wherein the first and second clock signals are complementary.

34. Shift register according to claim 31 wherein the first capacitance has a value slightly greater than the value of a stray capacitance of the first semiconductor output device.

35. Shift register according to claim 31 wherein the first capacitance has a value slightly less than the value of a stray capacitance of the first semiconductor output device.

36. Shift register according to claim 31 wherein the semiconductor device are amorphous silicon transistors.

37. Shift register according to claim 31 wherein the outputs of the stages are used for addressing an active matrix of a liquid crystal screen.

38. Shift register according to claim 31 wherein said shift register is included in integrated peripheral control circuits made up of selection line scanners and column scanners.

* * * * *